US005495198A

United States Patent [19]
Chen

[11] Patent Number: 5,495,198
[45] Date of Patent: Feb. 27, 1996

[54] SNUBBING CLAMP NETWORK

[75] Inventor: Wayne T. Chen, Plano, Tex.

[73] Assignee: Texas Instruments Incorporated, Dallas, Tex.

[21] Appl. No.: 176,816

[22] Filed: Jan. 4, 1994

[51] Int. Cl.$^6$ .......................... H03K 5/08; H03K 17/74; H03K 17/687; G05F 1/10
[52] U.S. Cl. .......................... 327/309; 327/326; 327/421; 327/427; 327/537
[58] Field of Search ........................ 327/309, 314, 327/325, 326, 108, 110, 180, 194, 580, 584, 537, 421, 502, 379, 389, 482, 427; 326/128, 131

[56] References Cited

U.S. PATENT DOCUMENTS

| | | | |
|---|---|---|---|
| 3,719,797 | 3/1973 | Andrews, Jr. et al. | 327/584 |
| 3,751,680 | 8/1973 | Hodges | 326/128 |
| 4,160,918 | 7/1979 | Nazarian et al. | 327/584 |
| 4,937,470 | 6/1990 | Zeiler | 327/309 |

*Primary Examiner*—Timothy P. Callahan
*Assistant Examiner*—Trong Phan
*Attorney, Agent, or Firm*—W. Daniel Swayze, Jr.; W. James Brady, III; Richard L. Donaldson

[57] ABSTRACT

A snubbing clamp network (14) is disclosed which comprises a gate voltage clamp (16) having an input and an output, the output connected to a first node, a gate-source voltage clamp (18) having an input connected to the first node and an output connected to the second node, and voltage reference (20) having an output connected to the input of the gate voltage clamp (16).

12 Claims, 3 Drawing Sheets

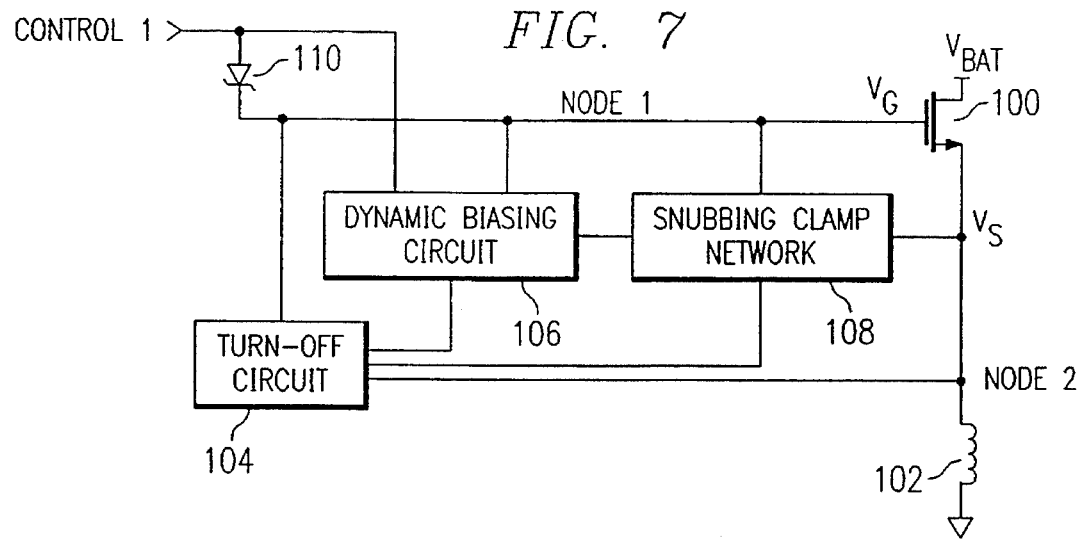
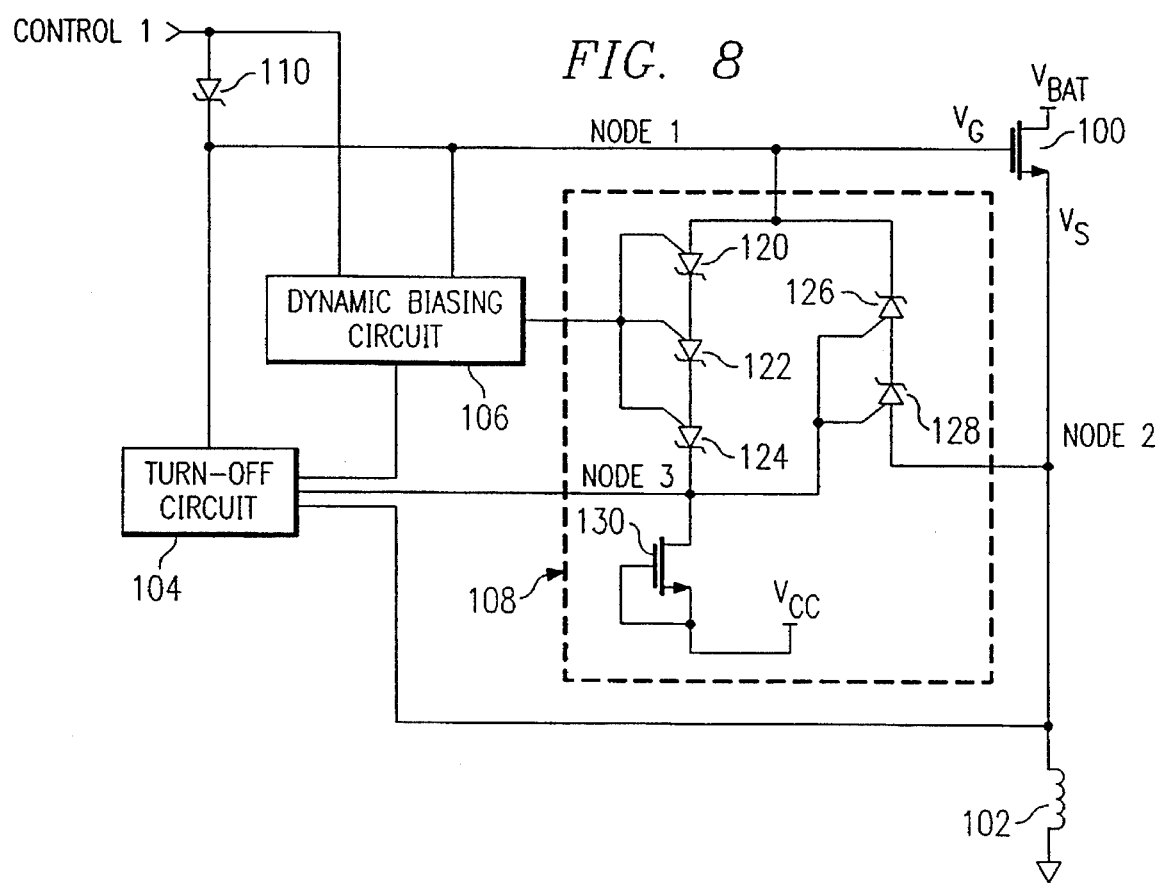

5,495,198

SNUBBING CLAMP NETWORK

TECHNICAL FIELD OF THE INVENTION

This invention relates in general to the field of electronic circuits, and more particularly to an improved snubbing clamp network and method of operation.

BACKGROUND OF THE INVENTION

Electronic circuits commonly utilize field effect transistors and bipolar transistors for various purposes. When an electronic circuit is formed on semiconductor material, the physical structure of the electronic circuit devices can cause problems that do not occur with discrete devices. For example, a transistor built on silicon can suffer from the triggering of undesired current paths and undesired parasitic devices. It is important in constructing electronic circuits to be formed on semiconductor substrates to prevent the occurrence of such undesired conditions. It is important also to consider the physical limitations of devices. For example, a finite breakdown voltage exists across the gate and source of a field effect transistor even though the gate and source theoretically are isolated.

SUMMARY OF THE INVENTION

A need has arisen for a snubbing clamp network that allows clamping of the voltage level of the gate of a field effect transistor and also allows the clamping of the difference between the voltage level of the gate and the voltage level of the source of a field effect transistor.

In accordance with the present invention, a snubbing clamp network is provided that substantially eliminates or reduces the disadvantages and problems associated with prior electronic circuits.

According to one embodiment of the present invention, a snubbing clamp network is provided that comprises a gate voltage clamp coupled to a first node having a first voltage level. A voltage reference having a substantially constant voltage level is coupled to the gate voltage clamp wherein the gate voltage clamp is operable to limit the first voltage of the first node with reference to the constant voltage level of the voltage reference. A gate-source voltage clamp is coupled to the first node and to a second node having a second voltage level operable to limit the second voltage level of the second node with reference to the first voltage level of the first node.

According to another embodiment of the present invention, a method of clamping voltage levels of a gate and a source of a field effect transistor are provided that comprise the following steps. A gate voltage clamp is connected to a gate of the field effect transistor. A voltage referencing having a substantially constant voltage level is connected to the gate voltage clamp, wherein the gate voltage clamp is operable to limit the voltage level of the gate with reference to the substantially constant voltage level of the voltage reference. A gate-source voltage clamp is connected to the gate and to the source of the field effect transistor, wherein the gate-source voltage clamp is operable to limit the voltage level of the source with reference to the voltage level of the gate.

BRIEF DESCRIPTION OF THE DRAWINGS

A more complete understanding of the present invention and the advantages thereof may be acquired by referring to the following description taken in conjunction with the accompanying drawings in which like reference numbers indicate like features and wherein:

FIG. 7 illustrates an integrated high side driver circuit constructed according to the teachings of the present invention; and FIG. 8 illustrates an integrated high side driver circuit including another embodiment of a snubbing clamp network constructed according to the teachings of the present invention.

DETAILED DESCRIPTION OF THE INVENTION

An n-channel field effect transistor has a finite breakdown voltage level across its gate and source even though theoretically the gate and the source are isolated. Accordingly, it is desirable to clamp the voltage level across the gate and the source of an n-channel field effect transistor to ensure that there is no breakdown across the gate and the source. This clamping is important when it is desired to place a negative voltage on the gate of the n-channel field effect transistor to turn off the transistor. This clamping can also protect against the drain to source breakdown of an n-channel field effect transistor.

Figure 1:
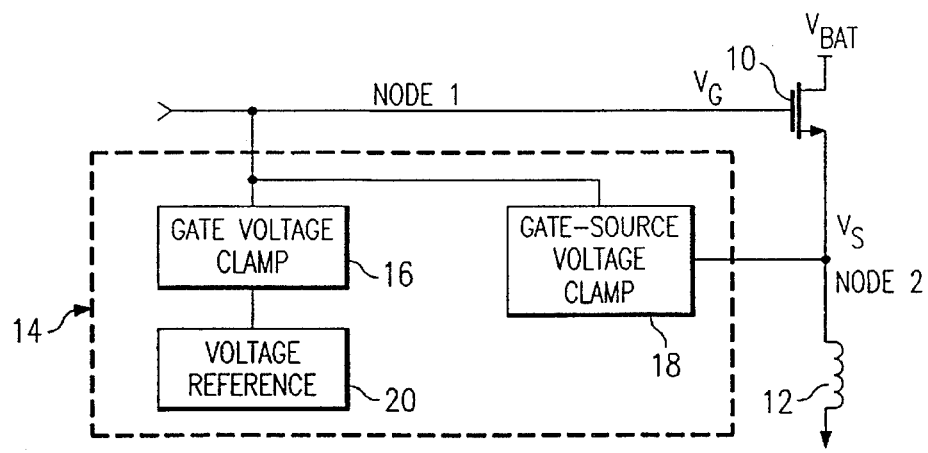
FIG. 1 illustrates an electronic circuit including a snubbing clamp network constructed according to the teachings of the present invention.

Referring to FIG. 1, an n-channel field effect transistor (N-FET) 10 has its drain connected to a positive power supply $V_{BAT}$, its gate connected to NODE 1, and its source connected to a NODE 2. An inductive load 12 is connected to NODE 2 and to ground potential. A snubbing clamp network 14 is connected to NODE 1 and to NODE 2. The snubbing clamp network 14 includes a gate voltage clamp 16 that has an input and an output with the output connected to NODE 1. The snubbing clamp network 14 further comprises a gate-source voltage clamp 18 that has an input connected to NODE 1 and an output connected to NODE 2 and a voltage reference 20 that has an output connected to the input of the gate voltage clamp.

In operation, the N-FET 10 operates as a switch between the positive power supply $V_{BAT}$ and NODE 2. When the N-FET 10 is turned on, the N-FET 10 allows current to flow from $V_{BAT}$ to NODE 2. The N-FET 10 is turned on when the voltage level $V_G$ of NODE 1 is larger than the threshold voltage of N-FET 10 with respect to the voltage level $V_S$ of NODE 2. Conversely, when the voltage level $V_G$ of NODE 1 is smaller than the threshold voltage of N-FET 10 with respect to the voltage level $V_S$ of NODE 2, the N-FET 10 is turned off and operates as an open circuit between $V_{BAT}$ and NODE 2. The circuit of FIG. 1 fluxes and defluxes inductive load 12. It is desirable to drive $V_G$ and the voltage level $V_S$ of NODE 2 very negative in order to fully turn off the N-FET 10 and to allow the inductive load 12 to deflux fully and rapidly. This defluxing process is called snubbing the inductive load 12.

The snubbing clamp network 14 operates to limit to what voltage level $V_G$ drops when $V_G$ drops negative during snubbing and operates to control the voltage level across NODE 1 and NODE 2. The gate voltage clamp 16 allows $V_G$ to drop negative until $V_G$ reaches a specific voltage level below a positive voltage reference set by the voltage reference 20. The gate voltage clamp 16 clamps $V_G$ to a voltage level below the positive voltage reference set by the voltage reference 20 once $V_G$ reaches the specific voltage level at which it is to be clamped. The gate voltage clamp 16 will hold $V_G$ at the specific voltage level below the positive voltage reference until the defluxing process of the inductive load 12 has completed and $V_G$ rises. The gate-source voltage clamp 18 operates to limit the difference in voltage between $V_G$ and $V_S$. After $V_G$ has been clamped by the gate voltage clamp 16, $V_S$ continues to drop negative because of the defluxing of the inductive load 12. If $V_S$ were allowed to continue to drop more and more negative, the difference between $V_G$ and $V_S$ could cause breakdown across the gate and source of the N-FET 10. The gate-source voltage clamp 18 operates to clamp the difference in the voltage levels of $V_G$ and $V_S$ to a specific voltage level if the difference becomes too large. This clamping ensures that no breakdown across the gate and source of the N-FET 10 will occur. The voltage reference 20 operates to provide a positive voltage reference for the gate voltage clamp to clamp the voltage level of NODE 1. The gate voltage clamp 16 and the gate-source voltage clamp 18 operate to clamp voltage levels during normal operation as well as during snubbing as described above.

Figure 2:
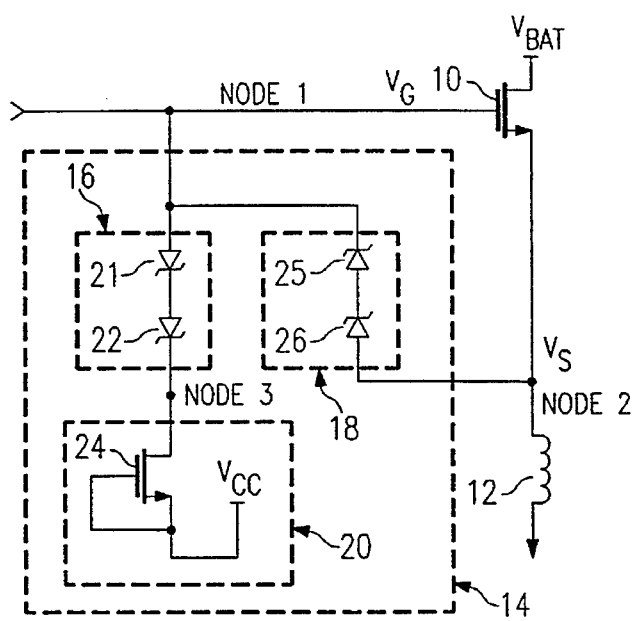
FIG. 2 illustrates another embodiment of a snubbing clamp network constructed according to the teachings of the present invention.

FIG. 2 illustrates another embodiment of a snubbing clamp network constructed according to the teachings of the present invention. FIG. 2 illustrates a particular embodiment of the snubbing clamp network 14 discussed with reference to FIG. 1. In the embodiment of FIG. 2, the gate voltage clamp 16 comprises a first zener diode 21 and a second zener diode 22. The first zener diode 21 has an anode coupled to NODE 1 and a cathode coupled to the anode of the second zener diode 22. The second zener diode 22 has an anode coupled to the cathode of the first zener diode 21 and a cathode coupled to a NODE 3. A voltage reference 20 includes an n-channel field effect transistor (N-FET) 24 that has a drain coupled to NODE 3 and a source coupled to a positive power supply $V_{CC}$. The gate of the N-FET 24 is coupled to the source of the N-FET 24. The gate-source voltage clamp 18 includes a third zener diode 25 and a fourth zener diode 26. The third zener diode 25 has a cathode coupled to NODE 1 and an anode coupled to the fourth zener diode 26. The fourth zener diode 26 has a cathode coupled to the third zener diode 25 and an anode coupled to NODE 2.

In operation, the snubbing clamp network 14 of FIG. 2 operates to limit the voltage level $V_G$ of NODE 1 and to clamp the difference between $V_G$ and the voltage level $V_S$ of NODE 2. The N-FET 24 is configured to operate like a diode with an anode connected to $V_{CC}$ and a cathode connected to the gate voltage clamp 16. Thus, the voltage reference 20 provides a voltage reference level of one diode voltage drop below $V_{CC}$ at NODE 3. In one embodiment of the present invention, $V_{CC}$ is approximately 5 volts. When the voltage level $V_G$ of NODE 1 drops negative, the zener diode 21 and the zener diode 22 operate to limit the voltage drop of $V_G$. When the difference between the voltage level of NODE 3 and the voltage level of NODE 1 becomes great enough to cause a reverse breakdown of zener diode 21 and zener diode 22, $V_G$ is clamped to a voltage level equal to $V_{CC}$ less a diode voltage drop and less the breakdown voltage of zener diode 21 and zener diode 22. After $V_G$ has been clamped, the voltage level $V_S$ of NODE 2 continues to drop negative. Zener diode 25 and zener diode 26 operate to limit the difference between $V_G$ and $V_S$. The zener diode 25 and the zener diode 26 break down and clamp the difference between $V_G$ and $V_S$ when $V_S$ drops negative to the point where the difference between $V_G$ and $V_S$ is equal to the breakdown voltage of zener diode 25 and zener diode 26. Thus, zener diode 25 and zener diode 26 operate to protect the gate-source Junction of the N-FET 10.

Figure 3A:
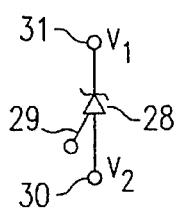
FIG. 3a illustrates a schematic representation of a zener diode.

FIG. 3a illustrates a schematic representation of a zener diode. A zener diode 28 has an n-well node 29, an anode 30 and a cathode 31. The n-well node 29 is used to bias the n-well of the zener diode 28. The voltage level at the cathode 31 of the zener diode 28 is $V_1$, and the voltage level at the anode 30 of the zener diode 28 is $V_2$. The zener diode 28 is forward biased when $V_2$ is more than a diode voltage drop higher than $V_1$. Zener diode 28 operates in the manner and with the characteristics of conventional zener diodes.

Figure 3B:
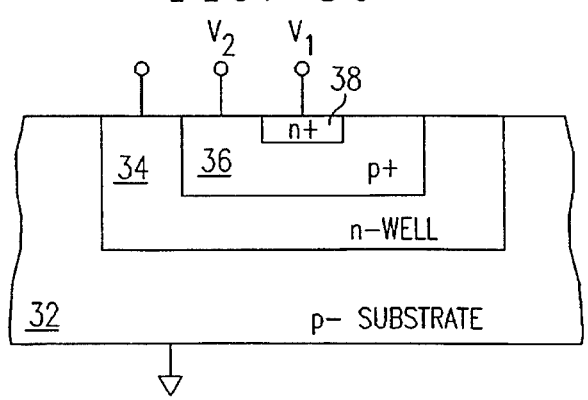
FIG. 3b illustrates a four-layer structure of a zener diode formed on a silicon substrate.

FIG. 3b illustrates a four-layer structure of a zener diode built on a silicon substrate. A p− substrate 32 is connected to ground potential, and an n-well 34 is formed in the p− substrate 32. A p+ region 36 and an n+ region 38 are formed inside the n-well 34. The voltage level of the n+ region 38 is $V_1$, and the voltage level of the p+ region 36 is $V_2$. This structure operates as the zener diode 28 of FIG. 3a with the p+ region 36 as the anode 30, and the n+ region 38 as the cathode 31, and the n-well 34 as the n-well node 29.

Figure 4:
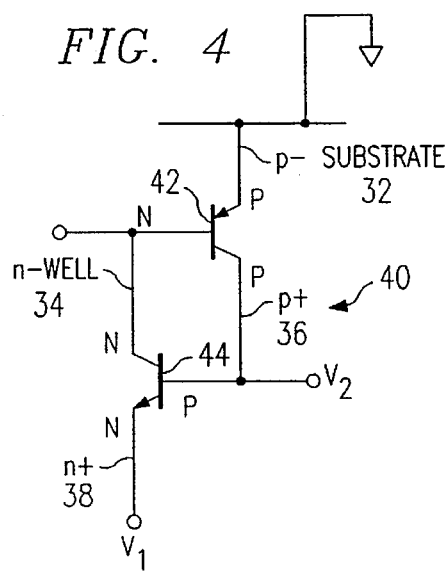
FIG. 4 illustrates a silicon controlled rectifier existing within the four-layer structure of FIG. 3b.

FIG. 4 illustrates a silicon controlled rectifier existing within the four-layer structure of FIG. 3b. A silicon controlled rectifier is a parasitic device that acts in a positive feedback mode to create undesirable current flow through an integrated system. A silicon controlled rectifier 40 has a pnp bipolar transistor 42 and an npn bipolar transistor 44. The p− substrate 32 of the zener diode of FIG. 3b acts as the emitter of the pnp bipolar transistor 42. The n-well 34 operates as the base of the pnp bipolar transistor 42 and the collector of the npn bipolar transistor 44. Similarly, the p+ region 36 acts as the collector of the pnp bipolar transistor 42 and the base of the npn bipolar transistor 44. Finally, the n+ region 38 acts as the emitter of the npn bipolar transistor 44. The emitter of the pnp bipolar transistor 42 is the p− substrate 32 which is connected to ground potential. The emitter of the npn bipolar transistor 44 has a voltage level $V_1$ and is the cathode of the zener diode. Similarly, the base of the npn bipolar transistor 44 and the collector of the pnp bipolar transistor 42 have a voltage level $V_2$ and are the anode of the zener diode.

In operation, the silicon controlled rectifier 40 functions as a positive feedback device to sink current from ground to the n+ region 38 when the voltage difference between ground potential and $V_1$ is greater than a diode and a bipolar transistor's emitter—collector saturation voltage drop. Anytime $V_1$ is less than $V_2$ and $V_2$ is less than ground potential, the silicon controlled rectifier is biased such that it will trigger and pull an ever increasing amount of current. In this state, the base emitter junction of the npn bipolar transistor 44 is forward biased. This causes current to flow in the base of the npn bipolar transistor 44. The npn bipolar transistor 44 amplifies the current flowing in the base, and allows current to flow from the collector to the emitter. The current in the collector of the npn bipolar transistor 44 is also current in the base of the pnp bipolar transistor 42. Because the emitter base junction of the pnp bipolar transistor 42 is forward biased, base current in the pnp bipolar transistor 42 will cause current to move from the emitter to the collector. The entire structure is a positive feedback device with ever-increasing current flow from the top to the bottom of FIG. 4. Current is drawn from the substrate to the n+ region because of the biasing of the silicon controlled rectifier 40. The triggering of a silicon controlled rectifier can cause burn-out of an integrated device or other failure resulting from side effects of the undesired current flow.

When the zener diode is operating in its breakdown region, the voltage level of $V_1$ is greater than the voltage level at $V_2$ reverse biasing the base emitter junction of the npn bipolar transistor 44. This normally would ensure that the npn bipolar transistor 44 would not conduct from the collector to the emitter. Thus, the silicon controlled rectifier 40 would not trigger. However, during the period of time before the zener diode breaks down and clamps the voltage difference between $V_1$ and $V_2$ to the zener breakdown level, the voltage $V_2$ is not well defined. If the n-well 34 is allowed to float and the p+ region 36 is not tied to a voltage reference, then $V_2$ is not well defined until the zener diode breaks down. Thus, it is possible for the silicon controlled rectifier 40 to trigger as $V_1$ drops below ground potential. A slight voltage drop across the base-emitter junction of the pnp bipolar transistor 42 causes current to flow, which then sets $V_2$ slightly higher than $V_1$ and forward biases the base emitter junction of the npn bipolar transistor 44. Once this condition occurs, the silicon controlled rectifier 40 triggers in the positive feedback manner described above. According to the teachings of the present invention, the n-well 34 is biased at a voltage level higher than the voltage level of the p-substrate 32 preventing the forward biasing of the junction between the p-substrate 32 and the n-well 34.

Figure 5:
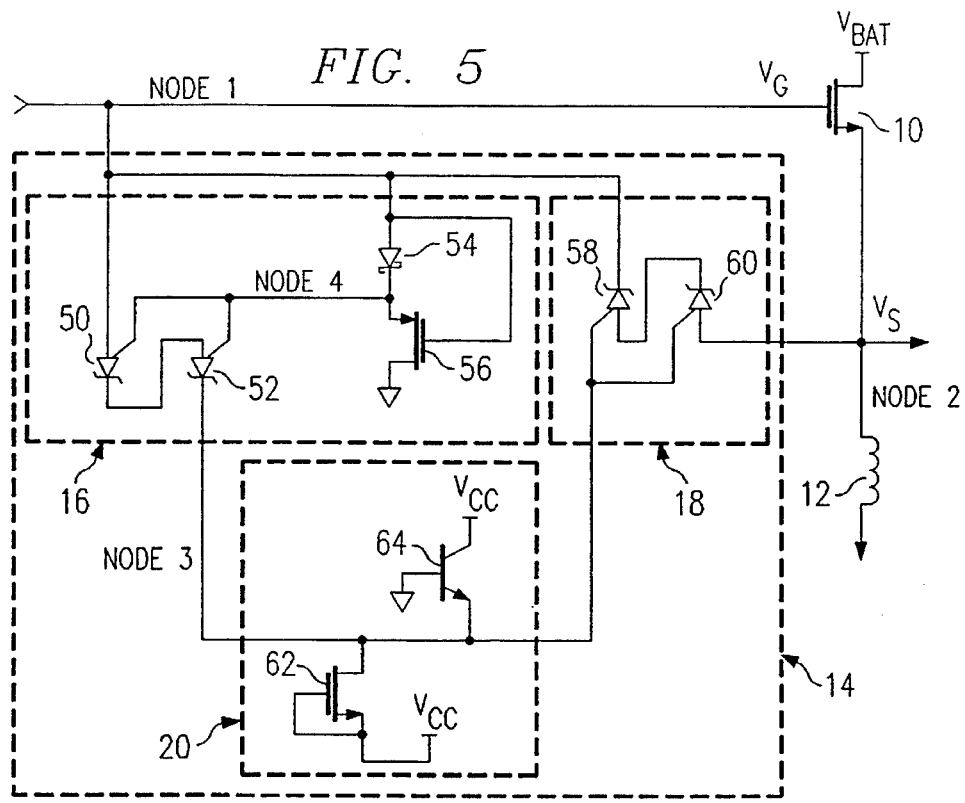
FIG. 5 illustrates an electronic circuit including another embodiment of a snubbing clamp network constructed according to the teachings of the present invention.

FIG. 5 illustrates another embodiment of a snubbing clamp network constructed according to the teachings of the present invention. An n-channel field effect transistor (N-FET) 10 has a drain connected to power supply $V_{BAT}$, a gate connected to a NODE 1 and a source connected to a NODE 2. An inductive load 12 is connected to NODE 2 and to ground potential. A gate voltage clamp 16 includes a first zener diode 50 and a second zener diode 52. Zener diodes 50 and 52 are formed according to the four-layer structure discussed above. Zener diodes 50 and 52 are n-well biased to prevent the firing of a silicon controlled rectifier as discussed with reference to FIGS. 3a, 3b, and 4. The anode of the first zener diode 50 is connected to NODE 1, and the cathode is connected to the second zener diode 52. The anode of the second zener diode 52 is connected to the first zener diode 50, and the cathode is connected to a NODE 3. The n-well nodes of the first zener diode 50 and the second zener diode 52 are connected to NODE 4. The gate voltage clamp 16 includes a diode 54 and a p-channel field effect transistor (P-FET) 56. The diode 54, which may alternatively comprise a Schottky diode, has an anode connected to NODE 1 and a cathode connected to a NODE 4. The P-FET 56 has a gate connected to NODE 1, a source connected to a NODE 4, and a drain connected to ground potential. A gate-source voltage clamp 18 includes a third zener diode 58 and a fourth zener diode 60. The anode of the third zener diode 58 is connected to the cathode of the fourth zener diode, and the cathode of the third zener diode 58 is connected to NODE 1. The anode of the fourth zener diode 60 is connected to NODE 2, and the cathode of the fourth zener diode 60 is connected to the anode of the third zener diode 58. The n-well nodes of the third zener diode 58 and the fourth zener diode 60 are connected to NODE 3. The voltage reference 20 includes an n-channel field effect transistor (N-FET) 62 and a collector guard-ring structure 64. The N-FET 62 has a drain connected to NODE 3 and a gate and a source connected to a positive voltage supply $V_{CC}$. The collector guard-ring structure 64 is an npn bipolar transistor. The emitter is connected to NODE 3, the base is connected to ground potential and the collector is connected to a positive voltage supply $V_{CC}$. All of the zener diodes illustrated in FIG. 5 are n-well biased to prevent the firing of a silicon controlled rectifier within the four-layer structure of the zener diodes.

In operation, the first zener diode 50 and the second zener diode 52 set up a negative clamping voltage for NODE 1. The voltage level $V_G$ of NODE 1 can go only as far negative as the zener diode 50 and zener diode 52 allow with reference to a diode drop beneath the positive voltage supply $V_{CC}$. The n-wells of the zener diode 50 and zener diode 52 are biased through the diode 54 and the P-FET 56. The diode 54 allows the voltage level of NODE 4 to rise with $V_G$, but does not allow the voltage level of NODE 4 to drop negative. Once $V_G$ drops below ground potential, the P-FET 56 is turned on and connects NODE 4 to ground potential. This holds the n-wells of the zener diode 50 and zener diode 52 to ground potential and prevents undesired forward biasing of the substrate to n-well junction. The diode 54 prevents current from flowing out of NODE 4 into NODE 1 and allowing the voltage level of NODE 1 to drop negative.

The N-FET 62 has a high breakdown voltage, and conducts through its body diode. The source of the N-FET 62 is connected to a positive supply $V_{CC}$. In one embodiment, $V_{CC}$ is about five volts. The N-FET 62 is tied to a positive potential to provide a reference to the first zener diode 50 and the second zener diode 52 and to bias the n-wells of the third zener diode 58 and the fourth zener diode 60. Because the gate of the N-FET 62 is connected to $V_{CC}$, the N-FET 62 is always off. In this configuration, the N-FET 62 operates as a diode with its anode at $V_{CC}$ and its cathode at NODE 3. The N-FET 62 thus holds the voltage level of NODE 3 at approximately one diode voltage drop below $V_{CC}$. The collector guard-ring structure 64 is a guard-ring structure around the N-FET 62. The collector guard-ring structure 64 is a sacrificial guard-ring and provides added protection to supply substrate currents if any appear. The guard ring structure is not necessary to the operation of the snubbing clamp network, but it is merely an added protection.

The third zener diode 58 and fourth zener diode 60 operate as a clamp across NODE 1 and NODE 2. Zener diode 58 and zener diode 60 protect the gate-source voltage of the N-FET 10 ensuring that the difference between $V_G$ and $V_S$ remains within a defined range. As with the first and second zener diodes 50 and 52, the third and fourth zener diodes 58 and 60 are illustrated having n-well biasing. The n-well nodes of the third zener diode 58 and the fourth zener diode 60 are connected to NODE 3 and form a high voltage n-well. Because NODE 3 is held to one diode voltage drop below $V_{CC}$ by the voltage reference 20, the n-wells of the third and fourth zener diodes 58 and 60 are held to a positive potential. This ensures that zener diode 58 and zener diode 60 are biased such that the silicon-controlled rectifier (SCR) structure will not fire when $V_S$ and $V_G$ go negative. After $V_G$ is clamped by the first and second zener diodes 50 and 52 and $V_S$ continues negative, the third and fourth zener diodes 58 and 60 are reversed biased. The SCR problem could occur because both $V_G$ and $V_S$ are negative and are below the substrate, as discussed with reference to FIG. 4. The SCR does not trigger because NODE 3 is held above ground potential. Thus, the parasitic pnp transistors associated with the third zener diode 58 and the fourth zener diode 60 are biased such that the SCR will not trigger. In operation, the electronic circuit of FIG. 5 allows $V_G$ to be clamped and allows $V_S$ to be clamped without causing a failure due to parasitic substrate currents or the triggering of an SCR.

Figure 6A:
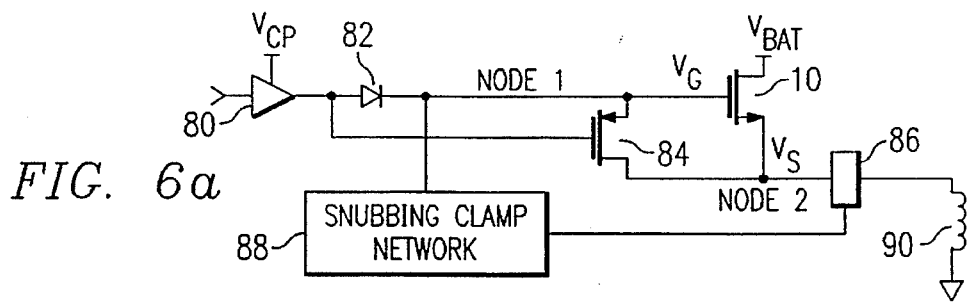
FIGS. 6a–6c illustrate a snubbing clamp network constructed according to the teachings of the present invention in different circuit topologies.

FIG. 6a illustrates the use of a snubbing clamp network constructed in accordance with the teachings of the present invention in one circuit topology. A gate drive 80 is connected to a diode 82 and a p-channel field effect transistor (P-FET) 84. The diode 82 has a cathode connected to NODE 1 and an anode connected to the gate drive 80. The P-FET 84 has a source connected to NODE 1, a drain connected to NODE 2, and a gate connected to the gate drive. An output pad 86 is connected to NODE 2 and provides electrical connection to NODE 2. An n-channel field effect transistor (N-FET) 10 has a gate connected to NODE 1, a source connected to NODE 2, and a drain connected to the positive power supply $V_{BAT}$. A snubbing clamp network 88 constructed according to the teachings of the present invention is connected to NODE 1 and to NODE 2 through the output pad 86. An inductive load 90 is connected to the output pad 86 and to ground potential.

In operation, the gate drive 80 provides current to the circuit. The diode 82 prevents charge from moving from the gate of N-FET 10 when the voltage of the gate drive 80 goes to ground potential. The P-FET 84 provides a discharge path from NODE 1 to NODE 2 when the voltage of the gate drive 80 goes to ground turning on the P-FET 84. The N-FET 10 operates as a switch, as discussed above, to flux and deflux the inductive load 90. The output pad 86 operates as a connection for the inductive load to NODE 2. The snubbing clamp network 88 operates to clamp the voltage level $V_G$ to some specified value when the voltage level of NODE 1 goes negative. The snubbing clamp network 88 also operates to clamp the difference between $V_G$ and $V_S$ to some specified value.

Figure 6B:
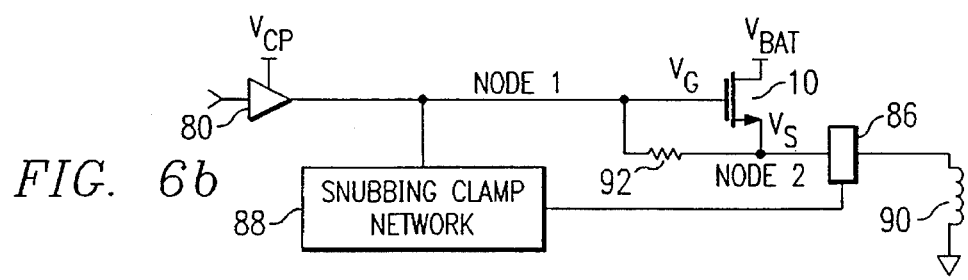

FIG. 6b illustrates a snubbing clamp network constructed according to the teachings of the present invention in another circuit topology. The gate drive 80 is connected directly to NODE 1. The N-FET 10 and the snubbing clamp network 88 are connected as in FIG. 6a, as are the output pad 86 and the inductive load 90. The difference in FIG. 6b is that a resistor 92 is connected between NODE 1 and NODE 2.

In operation, the resistor 92 operates to provide a discharge path current from NODE 1 to NODE 2, thus turning off the N-FET 10 and allowing the source and gate voltages $V_S$ and $V_G$ to go negative. The snubbing clamp network 88 allows $V_G$ to fall beneath ground potential before the clamp is achieved. The snubbing clamp network will then clamp $V_G$ and will clamp the difference between $V_G$ and $V_S$.

Figure 6C:
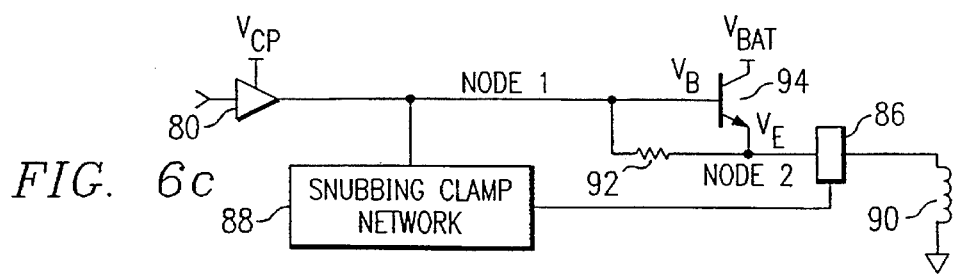

FIG. 6c illustrates a snubbing clamp network constructed according to the teachings of the present invention in another circuit topology. An npn bipolar transistor 94 has replaced the N-FET 10 of FIG. 6b, as shown. The gate drive 80 is again connected to NODE 1. The resistor 92 is connected between NODE 1 and NODE 2. The snubbing clamp network 88 is connected as before, as are the output pad 86 and the inductive load 88.

In operation, the gate drive 80 will stop supplying base current to the npn transistor 94. The resistor 92 will allow $V_E$, the voltage of the emitter of the npn transistor, to couple back into $V_B$, the voltage of the base of the transistor. This holds the npn transistor 92 off. As $V_B$ goes negative, the snubbing clamp network 88 will allow $V_B$ to go negative until the clamp voltage has been reached. The snubbing clamp network will also limit the difference between $V_B$ and $V_E$.

The snubbing clamp network of the present invention allows the clamping of the gate or base voltage of a power transistor and the clamping of the gate-to-source voltage or base-to-emitter voltage of a transistor when the voltages on the gate, source, base and emitter are driven negative. An advantage of the snubbing clamp network is that it allows clamping of these voltages at negative voltage levels without any loss of circuit function due to parasitic devices or currents within the structure of the circuit. In a common circuit structure with the substrate tied to ground potential, the negative voltages cause problems with parasitic substrate currents and the triggering of silicon controlled rectifiers. The present invention prevents such undesired effects, while allowing the clamping and control of the negative voltages.

FIG. 7 illustrates an integrated high side driver circuit constructed according to the teachings of the present invention. An n-channel field effect transistor (N-FET) 100 has its drain coupled to a power supply voltage $V_{BAT}$, its gate coupled to a NODE 1 and its source coupled to a NODE 2, as shown. The voltage level of NODE 1 is $V_G$ and the voltage level of NODE 2 is $V_S$. An inductive load 102 is coupled to NODE 2 and to ground potential. A control signal CONTROL 1 is coupled to NODE 1 and thus to the gate of the N-FET 100. A turn-off circuit 104 is coupled to NODE 1, to NODE 2, and to a dynamic biasing circuit 106 as shown. A snubbing clamp network 108 is coupled to NODE 1, NODE 2 and the dynamic biasing circuit 106 as shown.

In operation, the integrated high side driver circuit operates to drive the inductive load 102. One possible embodiment of turn-off circuit 104 is described in application Ser. No. 08/176,815, entitled "TURN-OFF CIRCUIT" (Texas Instruments Reference No. TI-18393) filed concurrently with the present application on Jan. 4, 1994, the disclosure of which is hereby incorporated by reference into the disclosure of the present application as if fully set forth herein. One possible embodiment of dynamic biasing circuit 106 described in application Ser. No. 08/177,811, entitled "DYNAMIC BIASING CIRCUIT" (Texas Instruments Reference No. TI-17749) filed concurrently with the present application on Jan. 4, 1994, the disclosure of which is hereby incorporated by reference into the disclosure of the present application as if fully set forth herein. The snubbing clamp network 108 operates as described in this application.

FIG. 8 illustrates an integrated high side driver circuit constructed according to the teachings of the present invention. A turn-off circuit 104, a dynamic biasing circuit 106, and a snubbing clamp network 108 are coupled as shown and as discussed with reference to FIG. 7. The snubbing clamp network 108 has a first zener diode 120, a second zener diode 122, and a third zener diode 124 connected between NODE 1 and NODE 3 as shown. The zener diodes 120, 122 and 124 have n-well node and are n-well biased by the dynamic biasing circuit 106. A zener diode 126 and a zener diode 128 are coupled between NODE 1 and NODE 2 as shown. Zener diodes 126 and 128 have n-well nodes and are n-well biased by NODE 3. An n-channel field effect transistor (N-FET) 130 is coupled to NODE 3 and to a positive power supply $V_{CC}$ as shown. The gate of the N-FET 130 is coupled to the source of the N-FET 130.

The snubbing clamp network of FIG. 3 operates in the same manner as that discussed with reference to FIG. 5. The only differences are that there is no collector guard ring structure and that the zener diodes 120, 122 and 124 are n-well biased by the dynamic biasing circuit 106. The snubbing clamp network 108 of FIG. 8 operates to clamp the voltage level $V_G$ of NODE 1 to a specified voltage drop below the level of $V_{CC}$. Once the voltage level of $V_G$ is clamped, the zener diodes 126 and 128 operate to clamp the voltage difference between NODE 1 and NODE 2. In this way, the snubbing clamp network allows control of the negative drop of the voltage level of NODE 1 and provides protection for the gate source junction of the N-FET 100. The operation of one possible embodiment of dynamic biasing circuit 106 is described in application Ser. No. 08/177,811, entitled "DYNAMIC BIASING CIRCUIT" (Texas Instruments Reference No. TI-17749). The operation of one possible embodiment of turn-off circuit 104 is described in Applicants' application Ser. No. 08/176,815, entitled "TURN-OFF CIRCUIT" (Texas Instruments Reference No. TI-18393).

Although the present invention has been described in detail, it should be understood that various changes, substitutions, and alterations can be made hereto without departing from the spirit and scope of the invention, as defined by the appended Claims.

What is claimed is:

1. A snubbing clamp network, comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node and to a second node having a second voltage level operable to limit the second voltage level of the second node with reference to the first voltage level of the first node, wherein the voltage reference comprises:
  a transistor having a first current path, a second current path and an input, the first current path coupled to the gate voltage clamp; and
  a positive voltage supply coupled to the second current path and the input of the transistor.

2. A snubbing clamp network, comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node and to a second node having a second voltage level operable to limit the second voltage level of the second node with reference to the first voltage level of the first node, wherein the voltage reference comprises:
  an n-channel field effect transistor having a drain, a source and a gate, the drain coupled to the gate voltage clamp; and
  a positive voltage supply coupled to the source and the gate of the n-channel field effect transistor.

3. A snubbing clamp network, comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node, to a second node having a second voltage level, and to the voltage reference operable to limit the second voltage level of the second node with reference to the first voltage level of the first node, wherein the gate voltage clamp comprises:
  a first zener diode having an anode, a cathode and an n-well node, the anode coupled to the first node, and the n-well node coupled to a third node;
  a second zener diode having an anode, a cathode and an n-well node, the anode coupled to the first zener diode, the cathode coupled to the voltage reference, and the n-well node coupled to the third node;
  a diode having an anode coupled to the first node and a cathode coupled to the third node operable to block current from flowing from the third node to the first node; and
  a transistor having an input coupled to the first node, a first current path coupled to the third node and a second current path coupled to ground potential, the transistor operable to dynamically bias the n-well node of the first zener diode and of the second zener diode.

4. A snubbing clamp network, comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node, to a second node having a second voltage level, and to the voltage reference operable to limit the second voltage level of the second node with reference to the first voltage level of the first node, wherein the gate voltage clamp comprises:
  a first zener diode having an anode coupled to the first node, having a cathode, and having an n-well node coupled to a third node;
  a second zener diode having an anode coupled to the first zener diode, having a cathode coupled to the voltage reference, and having an n-well node coupled to the third node;
  a Schottky diode having an anode coupled to the first node and having a cathode coupled to the third node, the Schottky diode operable to block current from flowing from the third node to the first node; and
  a transistor having an input coupled to the first node, a first current path coupled to the third node and a second current path coupled to ground potential operable to dynamically bias the n-well node of the first zener diode and of the second zener diode.

5. A snubbing clamp network, comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node, to a second node having a second voltage level, and to the voltage reference operable to limit the second voltage level of the second node with reference to the first voltage level of the first node, wherein the gate voltage clamp comprises:

a first zener diode having an anode coupled to the first node, having a cathode, and having an n-well node coupled to a third node;

a second zener diode having an anode coupled to the first zener diode, having a cathode coupled to the voltage reference, and having an n-well node coupled to the third node;

a diode having an anode coupled to the first node and having a cathode coupled to the third node, the diode operable to block current from flowing from the third node to the first node; and a p-channel field effect transistor having a gate coupled to the first node, a source coupled to the third node and a drain coupled to ground potential operable to dynamically bias the n-well node of the first zener diode and of the second zener diode.

6. A snubbing clamp network comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node, to a second node having a second voltage level, and to the voltage reference operable to limit the second voltage level of the second node with reference to the first voltage level of the first node, wherein the voltage reference comprises:

a first transistor having a first current path, a second current path and an input, the first current path coupled to the gate voltage clamp;

a positive voltage supply coupled to the second current path and the input of the transistor; and a second transistor having a first current path coupled to the positive voltage supply, a second current path coupled to the first transistor and an input coupled to ground potential.

7. A snubbing clamp network, comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node, to a second node having a second voltage level, and to the voltage reference operable to limit the second voltage level of the second node with reference to the first voltage level of the first node, wherein the voltage reference comprises:

an n-channel field effect transistor having a drain, a source and a gate, the drain coupled to the gate voltage clamp;

a positive voltage supply coupled to the source and the gate of the n-channel field effect transistor; and a transistor having a first current path coupled to the positive voltage supply, a second current path coupled to the drain of the n-channel field effect transistor and an input coupled to ground potential.

8. A snubbing clamp network, comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node, to a second node having a second voltage level, and to the voltage reference operable to limit the second voltage level of the second node with reference to the first voltage level of the first node, wherein the voltage reference comprises:

a first transistor having a first current path, a second current path and an input, the first current path coupled to the gate voltage clamp;

a positive voltage supply coupled to the second current path and the input of the transistor; and a npn bipolar transistor having a collector coupled to the positive voltage supply, an emitter coupled to the first transistor and a base coupled to ground potential.

9. A snubbing clamp network, comprising:

a gate voltage clamp coupled to a first node having a first voltage level;

a voltage reference having a substantially constant voltage level coupled to the gate voltage clamp, wherein the gate voltage clamp is operable to limit the first voltage of the first node with reference to the constant voltage level of the voltage reference; and a gate-source voltage clamp coupled to the first node, to a second node having a second voltage level, and to the voltage reference operable to limit the second voltage level of the second node with reference to the first voltage level of the first node, wherein the gate-source voltage clamp comprises:

a first zener diode having a cathode coupled to the first node, having an anode, and having an n-well node coupled to the voltage reference; and a second zener diode having a cathode coupled to the first zener diode, having an anode coupled to the second node, and having an n-well node coupled to the voltage reference.

10. A method of clamping voltage levels of a gate and a source of a field effect transistor, comprising the steps of:

connecting a gate voltage clamp to a gate of the field effect transistor;

connecting a voltage reference having a substantially constant voltage level to the gate voltage clamp, wherein the gate voltage clamp is operable to limit the voltage level of the gate with reference to the substantially constant voltage level of the voltage reference;

connecting a gate-source voltage clamp to the gate and to the source of the field effect transistor, wherein the gate-source voltage clamp is operable to limit the voltage level of the source with reference to the voltage level of the gate and wherein the step of connecting a voltage reference comprises the steps of:

connecting a voltage reference comprising a transistor having an input, a first current path and a second current path, the first current path connected to the gate voltage clamp and comprising a positive voltage supply connected to the input and the second current path of the transistor.

11. A method of clamping voltage levels of a gate and a source of a field effect transistor, comprising the steps of:

connecting a gate voltage clamp to a gate of the field effect transistor;

connecting a voltage reference having a substantially constant voltage level to the gate voltage clamp, wherein the gate voltage clamp is operable to limit the voltage level of the gate with reference to the substantially constant voltage level of the voltage reference;

connecting a gate-source voltage clamp to the gate and to the source of the field effect transistor, wherein the gate-source voltage clamp is operable to limit the voltage level of the source with reference to the voltage level of the gate and wherein the steps of connecting a voltage reference comprises the steps of:

connecting a voltage reference comprising a transistor having an input, a first current path and a second current path, the first current path connected to the gate voltage clamp and comprising a five volt voltage supply connected to the input and the second current path of the transistor.

12. A method of clamping voltage levels of a gate and a source of a field effect transistor, comprising the steps of:

connecting a gate voltage clamp to a gate of the field effect transistor;

connecting a voltage reference having a substantially constant voltage level to the gate voltage clamp, wherein the gate voltage clamp is operable to limit the voltage level of the gate with reference to the substantially constant voltage level of the voltage reference;

connecting a gate-source voltage clamp to the gate and to the source of the field effect transistor, wherein the gate-source voltage clamp is operable to limit the voltage level of the source with reference to the voltage level of the gate and wherein the step of connecting a voltage reference comprises:

connecting a voltage reference comprising an n-channel field effect transistor having a drain, a source and a gate, the drain connected to the gate voltage clamp and comprising a positive voltage supply connected to the source and the gate of the n-channel field effect transistor.

* * * * *